US 6,603,691 B2

(12) United States Patent
Yoo et al.

(10) Patent No.: US 6,603,691 B2
(45) Date of Patent: Aug. 5, 2003

(54) SEMICONDUCTOR DEVICE INCLUDING BUILT-IN REDUNDANCY ANALYSIS CIRCUIT FOR SIMULTANEOUSLY TESTING AND ANALYZING FAILURE OF A PLURALITY OF MEMORIES AND METHOD FOR ANALYZING THE FAILURE OF THE PLURALITY OF MEMORIES

(75) Inventors: Young-Doo Yoo, Seoul (KR); Hong-shin Jun, Seongnam (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 09/981,456

(22) Filed: Oct. 17, 2001

(65) Prior Publication Data

US 2002/0159305 A1 Oct. 31, 2002

(30) Foreign Application Priority Data

Oct. 18, 2000 (KR) .......................................... 2000-61409

(51) Int. Cl.[7] ................................................ G11C 7/00
(52) U.S. Cl. .................................. 365/201; 365/230.03
(58) Field of Search ........................... 365/201, 230.03, 365/185.09, 185.11, 189.07; 711/5, 154; 714/718, 720

(56) References Cited

U.S. PATENT DOCUMENTS 6,385,746 B1 * 5/2002 Tatsumi ..................... 714/718
6,415,399 B1 * 7/2002 Yamaoka ................... 714/718
6,501,690 B2 * 12/2002 Satoh ........................ 365/201

* cited by examiner

Primary Examiner—Tan T. Nguyen
(74) Attorney, Agent, or Firm—Mills & Onello, LLP

(57) ABSTRACT

A semiconductor device including a built-in redundancy analysis (BIRA) circuit for simultaneously testing and analyzing failures of a plurality of memories, and a failure analyzing method, includes a plurality of memory blocks, a plurality of built-in redundancy analysis units for outputting a group of failure repairing information signals by testing and analyzing a corresponding memory block among the plurality of memory blocks in response to common driving signals and each of independent selection signals, and a controller for generating the common driving signals and the respective independent selection signals in response to a plurality of externally applied control signals and sequentially receiving and sequentially outputting the group of failure repairing information signals generated from the respective built-in redundancy analysis units. According to the semiconductor device and the failure analyzing method, it is possible to reduce the test time and expense since a plurality of memories having different sizes can be simultaneously tested and analyzed.

11 Claims, 6 Drawing Sheets

SEMICONDUCTOR DEVICE INCLUDING BUILT-IN REDUNDANCY ANALYSIS CIRCUIT FOR SIMULTANEOUSLY TESTING AND ANALYZING FAILURE OF A PLURALITY OF MEMORIES AND METHOD FOR ANALYZING THE FAILURE OF THE PLURALITY OF MEMORIES

BACKGROUND OF THE INVENTION

1. Field of the Invention

The present invention relates to a semiconductor device, and more particularly, to a semiconductor device including a built-in redundancy analysis (BIRA) circuit for testing and analyzing the failure of a plurality of memories, that is, a built-in redundancy analysis unit and a method for analyzing the failure of the plurality of memories using the built-in redundancy analysis unit.

2. Description of the Related Art

Contemporary integrated circuits, or chips are commonly designed and manufactured using deep sub-micron (DSM) technology. As an increasing amount of memory becomes built-in, or integrated, into the chip circuitry, the yield of the memory component significantly affects the yield of the entire chip. Accordingly, a repairable memory is necessary in order to improve yield.

Also, as semiconductor devices become more highly integrated and their functions become more complicated, various new methods must be developed for effectively testing them. In particular, a built-in self test (BIST) method has been developed in order to effectively test a memory that is built into a semiconductor memory device. In this method, a built-in memory is tested using a circuit in which a memory test algorithm is realized.

A built-in redundancy analysis (BIRA) technology which, unlike the BIST for testing memories, is capable of extracting information on testing, analyzing the failure of, and repairing built-in repairable memories using a BIST test method, has recently appeared. Namely, after testing memories using the BIST and storing information on failure, the memories are repaired through the built-in self repair (BISR) method and the repairing result is output using a scan chain. A method of dividing a block of memory into many smaller blocks and simultaneously testing the blocks and analyzing the failure of the blocks is used. This method has an advantage in that the time spent on testing the blocks and analyzing the failure of the blocks can be reduced when the size of a memory is large.

When a memory is tested and analyzed using the above-mentioned conventional methods, various memories having different sizes must be separately tested and analyzed. Also, in the method of storing a failure generated in the respective test circumstances and comparing the failures with each other, a process of separately analyzing the failures additionally generated according to circumstances is necessary since the failure found in the worst circumstance and the failure found in the best circumstance cannot be analyzed at one time when they are different from each other. The method of dividing a memory block into many smaller blocks and simultaneously testing the blocks and analyzing the failure of the blocks has a disadvantage in that the area required for simultaneously processing the divided blocks becomes large when many memories are tested. Namely, according to the above-mentioned conventional methods, it is possible to effectively test and analyze a single memory, however, the conventional methods are disadvantageous in testing and analyzing chips that include multiple memory blocks having different sizes, because of limitations in the test time and the number of pins.

SUMMARY OF THE INVENTION

It is a first object of the present invention to provide a semiconductor device including a built-in redundancy analysis (BIRA) circuit, that is, a BIRA unit which is capable of reducing the time taken to test a memory and the number of pins of the memory by simultaneously testing and analyzing the failure of a plurality of memories.

It is a second object of the present invention to provide a method for analyzing the failure of the plurality of memories, which is capable of reducing the test time and the number of pins by simultaneously testing and analyzing the failure of a semiconductor device including a plurality of memories.

Accordingly, to achieve the first object, there is provided a semiconductor device comprising a plurality of memory blocks, a plurality of built-in redundancy analysis units, and a controller.

The plurality of built-in redundancy analysis units outputs a group of failure repairing information signals by testing and analyzing a corresponding memory block among the plurality of memory blocks in response to common driving signals and each of a plurality of separate, independent, selection signals.

The controller generates the common driving signals and the respective separate selection signals in response to a plurality of externally applied control signals and sequentially receives and sequentially outputs the group of failure repairing information signals generated by the respective built-in redundancy analysis units.

Each of the built-in redundancy analysis units comprises a control signal generator, a data generator, a comparator, and a failure analysis unit.

The control signal generator generates a control signal for controlling the testing and analyzing operations and some of a group of failure repairing information signals in response to some of the common driving signals and some of the separate selection signals.

The data generator is controlled by the control signal generator and generates data input signals for testing a corresponding memory block among the memory blocks and comparison data to be compared with read data read from the memory.

The comparator is controlled by the control signal generator and compares read data read from the memory block with the comparison data.

The failure analysis unit is controlled by the control signal generator and receives a data failure signal generated by the comparator in response to other signals among the separate selection signals and other signals among the common driving signals and generating other signals among a group of failure repairing information signals.

To achieve the second object of the present invention, there is provided a failure analyzing method with respect to a semiconductor device comprising a plurality of memory blocks, comprising the steps of: (a) applying a plurality of externally paplied control signals; (b) generating common driving signals and each of the separate selection signals in response to the control signals; (c) testing and analyzing the respective memory blocks and generating and storing a group of failure repairing information signals with respect to the memory blocks in response to the common driving signals and each separate selection signal; and (d) sequentially receiving the group of failure repairing information signals and sequentially outputting the group of failure repairing information signals to the outside of the semiconductor device. The failure analyzing method may further comprise the step of: (e) simultaneously performing a retention test on the plurality of memory blocks in response to the common driving signals.

BRIEF DESCRIPTION OF THE DRAWING(S)

The above objects and advantages of the present invention will become more apparent by describing in detail preferred embodiments thereof with reference to the attached drawings in which.

Figure 1:
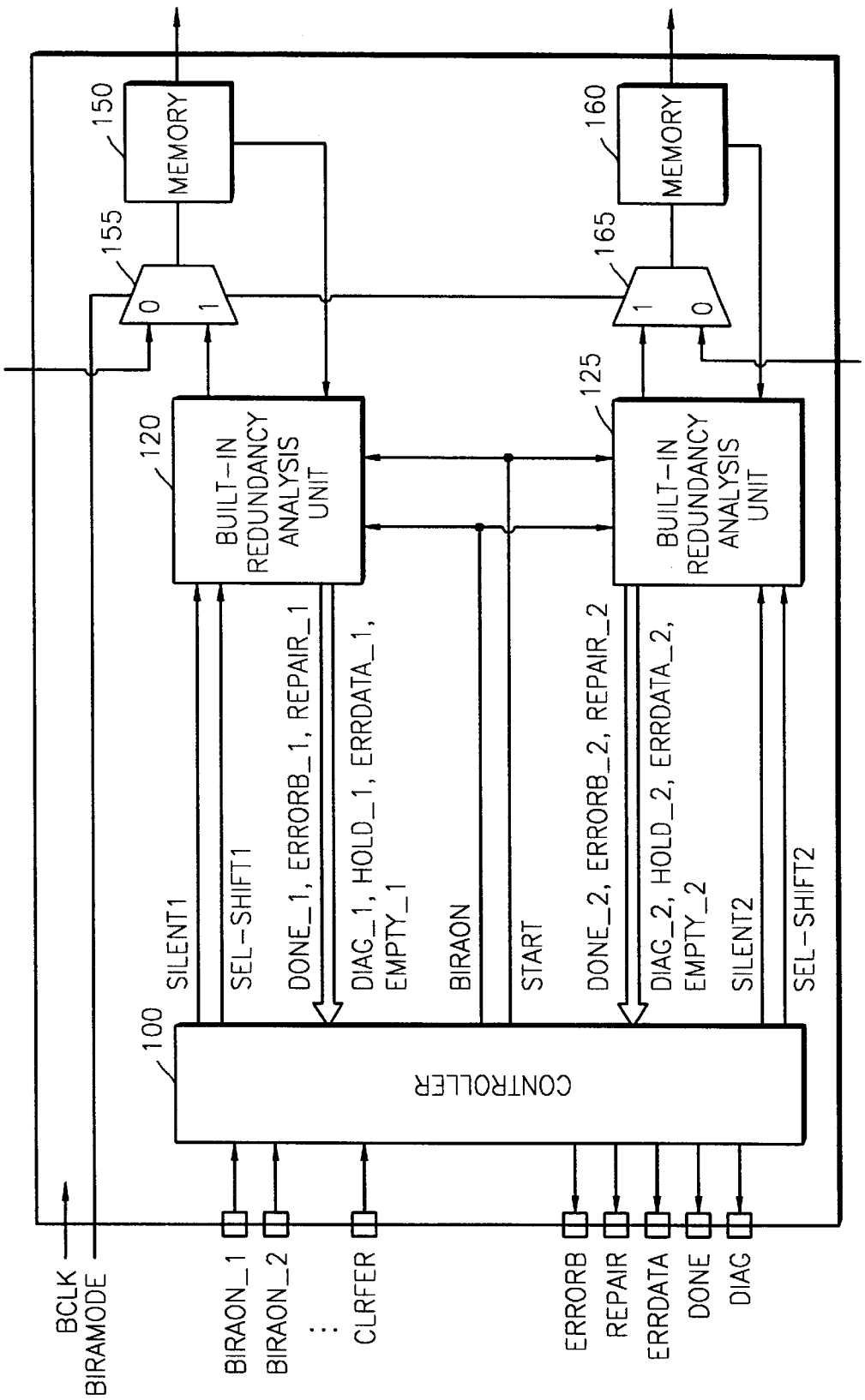
FIG. 1 is a schematic block diagram showing the connection structure of a semiconductor device including a built-in redundancy analysis (BIRA) unit for simultaneously testing and analyzing the failure of a plurality of memories according to an embodiment of the present invention.
Figure 6:
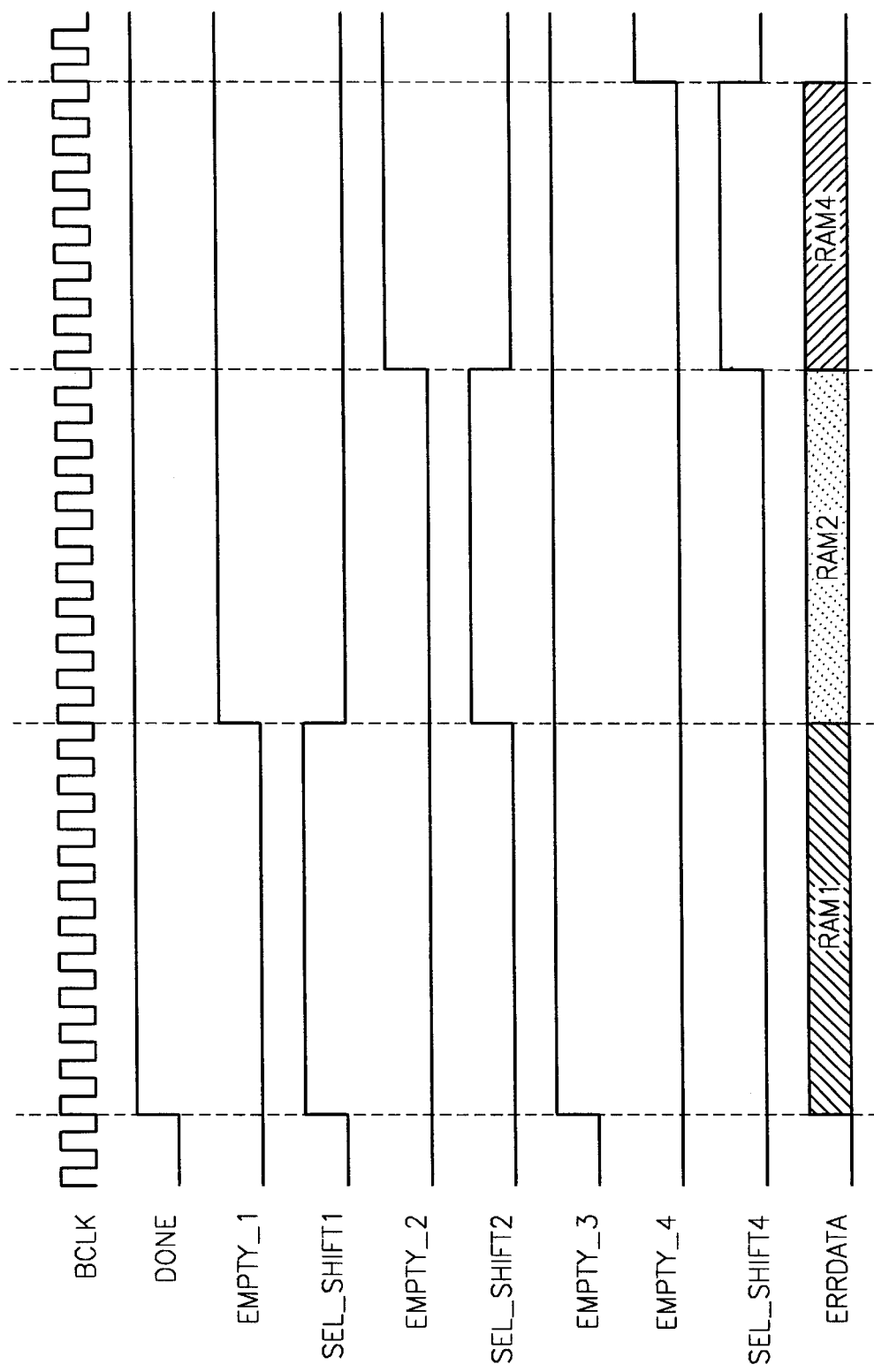
Figure 7:
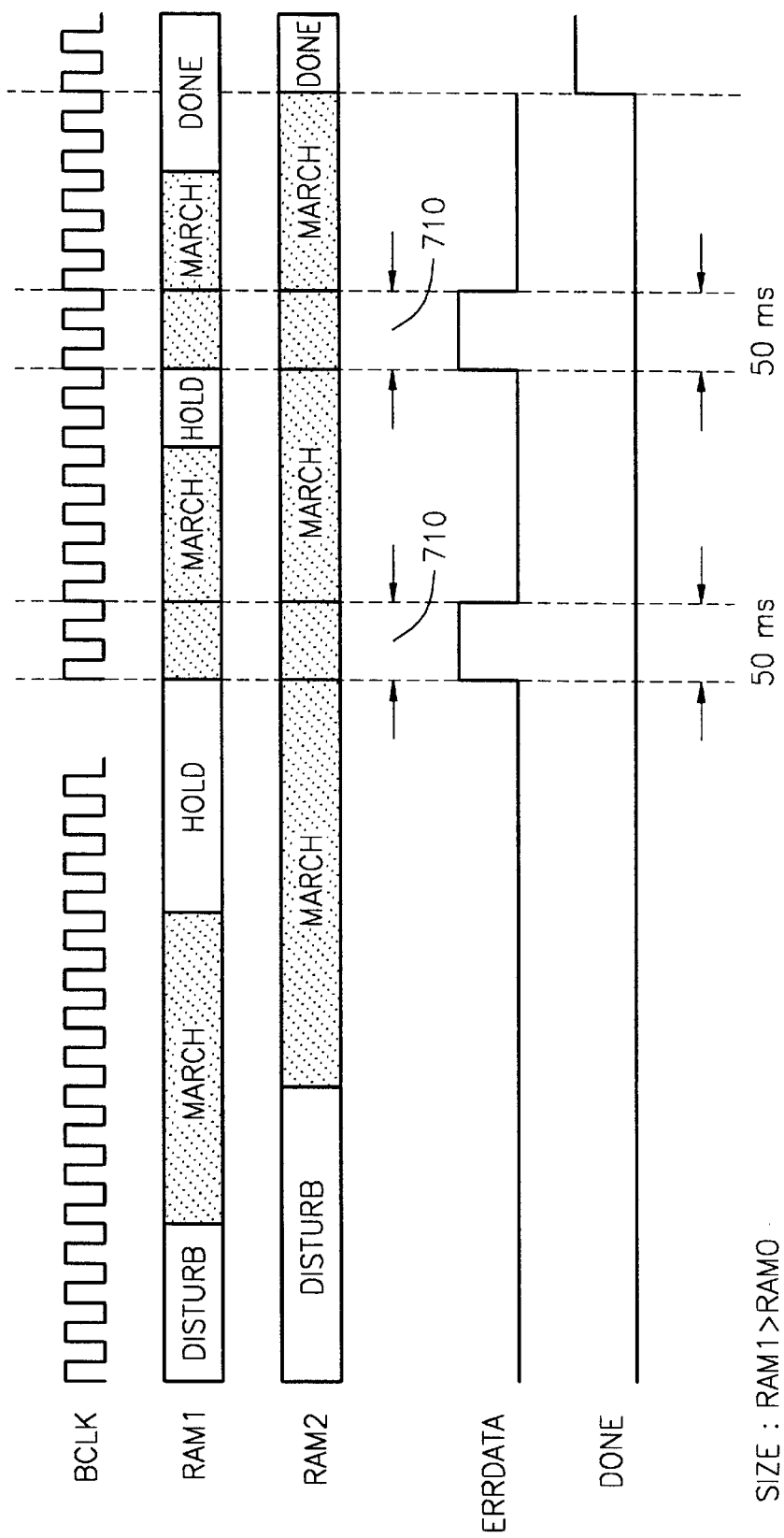

FIG. 6 is a timing diagram showing that failure repairing data with respect to four or more memories of the semiconductor device according to the embodiment of the present invention, which is shown in FIG. 1 are sequentially output; and FIG. 7 is a timing diagram showing a retention test with respect to memories having different sizes of the semiconductor device according to the embodiment of the present invention, which is shown in FIG. 1.

DETAILED DESCRIPTION OF PREFERRED EMBODIMENTS

The present invention now will be described more fully with reference to the accompanying drawings, in which preferred embodiments of the invention are shown. In the drawings, the same reference numerals in different drawings represent the same element, and thus their description will be omitted.

Referring to FIG. 1, a semiconductor device according to an embodiment of the present invention includes a plurality of memory blocks 150 and 160, multiplexers 155 and 165, a plurality of built-in redundancy analysis units 120 and 125, and a controller 100.

The first built-in redundancy analysis unit 120 tests and analyzes a corresponding first memory block 150 among the plurality of memory blocks 150 and 160. The units 120 communicate with the controller 100, and output a number of failure-repairing information signals DONE_1, ERRORB_1, REPAIR_1, DIAG_1, HOLD_1, ERRDATA_1, and EMPTY_1 in response to common driving signals BIRAON and START and respective separate selection signals SILENT1 and SEL-SHIFT1, generated at the controller.

The controller 100 generates the common driving signals BIRAON and START and the respective separate selection signals SILENT1 and SEL-SHIFT1 in response to a plurality of externally-applied control signals BIRAON_1 and CLRFER and receives and outputs the group of failure repairing information signals DONE_1, ERRORB_1, REPAIR_1, DIAG_1, HOLD_1, ERRDATA_1, EMPTY_1 received from the built-in redundancy analysis unit 120.

The second built-in redundancy analysis unit 125 tests and analyzes the corresponding second memory block 160 among the plurality of memory blocks 150 and 160 and outputs a group of failure repairing information signals DONE_2, ERRORB_2, REPAIR_2, DIAG_2, HOLD_2, ERRDATA_2, and EMPTY_2 in response to the common driving signals BIRAON and START and respective separate selection signals SILENT2 and SEL-SHIFT2.

The controller 100 generates the common driving signals BIRAON and START and the respective separate selection signals SILENT2 and SELF-SHIFT2 in response to a plurality of externally-applied control signals BIRAON_2 and CLRFER and receives and outputs the group of failure repairing information signals DONE_2, ERRORB_2, REPAIR_2, DIAG_2, HOLD_2, ERRDATA_2, and EMPTY_2 received from the built-in redundancy analysis unit 125.

The operation of the semiconductor device according to the embodiment of the present invention will now be described in detail with reference to FIG. 1.

When a test selection signal BIRAMODE is selected to be at a logic "high" level in order to place operation in the test mode, only signals for a test operation are selected by the multiplexes 155 and 165. The built-in redundancy analysis units 120 and 125 are initialized when the common driving signal BIRAON is at a logic "low" level. The built-in redundancy analysis units 120 and 125 operate when the common driving signal BIRAON and the test selection signal BIRAMODE are at the logic "high" level. The common driving signal BIRAON and the test selection signal BIRAMODE are maintained to be at the logic "high" level while the test is performed. When the common driving signal BIRAON is maintained to be at the logic "low" level for several clock cycles (for example, about 10 clock cycles) and then transitions to the logic "high" level, the built-in redundancy analysis units 120 and 125 operate again after undergoing a reset process.

When either the control signal BIRAON_1 or the control signal BIRAON_2 is selectively activated in a test mode, the controller 100 generates the common driving signal BIRAON and the built-in redundancy analysis units 120 and 125 receive the common driving signal BIRAON and are simultaneously driven. The built-in redundancy analysis units 120 and 125 are driven by receiving the common driving signal BIRAON generated by the controller 100. However, the built-in redundancy analysis units that are not selected by the control signals BIRAON_1 and BIRAON_2 place the mode of the memories 150 and 160 in a power-down mode in response to the separate selection signals SILENT1 and SILENT2 and therefore, these memory blocks do not perform the test operation. Therefore, since the built-in redundancy analysis units 120 and 125 selected by the separate selection signals SILENT1 and SILENT2 do not control the memories, it is possible to minimize the amount of power consumed by the memories when the memories are selectively tested.

In the case of a repairable memory, a retention test is performed that employs a method of writing a uniform pattern and reading the pattern after 50 ms. Since the built-in redundancy analysis units 120 and 125 that are not selected by the control signals BIRAON_1 and BIRAON_2 convert the mode of the memories into a power down mode in response to the separate selection signals SILENT1 and SILENT2 and the built-in redundancy analysis units 120 and 125 are driven by receiving the common driving signal BIRAON generated by the controller 100 regardless of whether or not the built-in redundancy analysis units 120 and 125 perform the test operation, a uniform retention test point is output. Namely, it is possible to minimize the test time since the retention test is simultaneously performed on the respective memories regardless of the selected memories.

The built-in redundancy analysis units 120 and 125 are in a hold state for the retention test and the common driving signal START is generated by the controller 100 in order to again drive the built-in redundancy analysis units 120 and 125 that are in the hold state. The common driving signal START is activated to the logic "high" level only for two clock cycles, thus operating the built-in redundancy analysis units 120 and 125. The retention test will be described below in detail with reference to FIG. 7.

The controller 100 receives the group of failure repairing information signals DONE_1, ERRORB_1, REPAIR_1, DIAG_1, HOLD_1, ERRDATA_1, and EMPTY_1 from the first built-in redundancy analysis unit 120 and outputs them. Since a plurality of memories are simultaneously tested and analyzed, it is determined by the empty signal EMPTY_1 among the group of failure repairing information signals DONE_1, ERRORB_1, REPAIR_1, DIAG_1, HOLD_1, ERRDATA_1, and EMPTY_1 whether failure repairing data ERRDATA_1, which is information data on failure repairing, exists. The first built-in redundancy analysis unit 120, in which the failure repairing data ERRDATA_1 exists, is controlled by the separate selection signal SEL-SHIFT1 generated by the controller 100, thus generating the failure repairing data ERRDATA_1. Then, the second built-in redundancy analysis unit 125 is selected.

The controller 100 receives and outputs the group of failure repairing information signals DONE_2, ERRORB_2, REPAIR_2, DIAG_2, HOLD_2, ERRDATA_2, and EMPTY_2 generated by the second built-in redundancy analyzing portion 125 after the test of the first built-in redundancy analysis unit 120 is completed. Since a plurality of memories are simultaneously tested and analyzed, the empty signal EMPTY_2 among the group of failure repairing information signals DONE_2, ERRORB_2, REPAIR_2, DIAG_2, HOLD_2, ERRDATA_2, and EMPTY_2 generated, based on a predetermined order, by the built-in redundancy analysis unit 125, is used to determine whether failure repairing data ERRDATA_2 exists, which is information data on failure repairing. The second built-in redundancy analysis unit 125, in which the failure repairing data ERRDATA_2 exists, is controlled by the separate selection signal SEL-SHIFT2 generated by the controller 100, thus generating the failure repairing data ERRDATA_2. Then, another built-in redundancy analysis unit (not shown) is selected and the above operation is repeated.

The operation of the respective signals of the group of failure repairing information signals DONE_1, ERRORB_1, REPAIR_1, DIAG_1, HOLD_1, ERRDATA_1, EMPTY_1, DONE_2, ERRORB_2, REPAIR_2, DIAG_2, HOLD_2, ERRDATA_2, and EMPTY_2 will be described in more detail.

When the sizes of the tested memories are different from each other, the point of time at which the built-in redundancy analysis units 120 and 125 are terminated varies. Then, the signals DONE_1 and DONE_2 transition from the logic "low" level to the logic "high" level, which indicated that the operations of the respective built-in redundancy analysis units 120 and 125 are terminated.

The signals ERRORB_1 and ERRORB_2, which determine whether a memory has a failure, are at the logic "low" level for one clock cycle if a failure is found and are then returned to the logic "high" level. Then, when the operations of the built-in redundancy analysis units 120 and 125 are terminated, the signals ERRORB_1 and ERRORB_2 are maintained at the logic "low" level. The address of the defective portion of a memory can be calculated using a clock count, at which the levels of the signals ERRORB_1 and ERRORB_2 are transitioned. When the signals ERRORB_1 and ERRORB_2 are maintained at the logic "high" level following the operations of the built-in redundancy analysis units 120 and 125, this means that none of the tested memories have no defects.

The repair signals REPAIR_1 and REPAIR_2 that determine whether the tested memory is repairable indicate that the defect of the memory cannot be repaired when the repair signals REPAIR_1 and REPAIR_2 are at the logic "low" level. The repair signals REPAIR_1 and REPAIR_2 are at the logic "low" level when even one memory block among the tested memories cannot be repaired.

The diagnosis signals DIAG_1 and DIAG_2, which self-test the internal signals of the built-in redundancy analysis units 120 and 125, check the signals for 14 cycles at points of time where the built-in redundancy analysis units 120 and 125 operate and terminate, and are used as a quick test of the built-in redundancy analysis units 120 and 125.

The failure repairing data signal ERRDATA is a signal that is output as a retention test point when the test is performed and as information data required for repairing failure after the test is terminated. The retention test is performed twice in a state where the signals DONE_1 and DONE_2 are at the logic "low" level. When the repair signals REPAIR_1 and REPAIR_2 are at the logic "low" level, the failure repairing data ERRDATA is not output as information data required for repairing the failure. When the signals DONE_1 and DONE_2 are at the logic "high" level, the failure repairing data ERRDATA is maintained to be at the logic "low" level.

Figure 3:
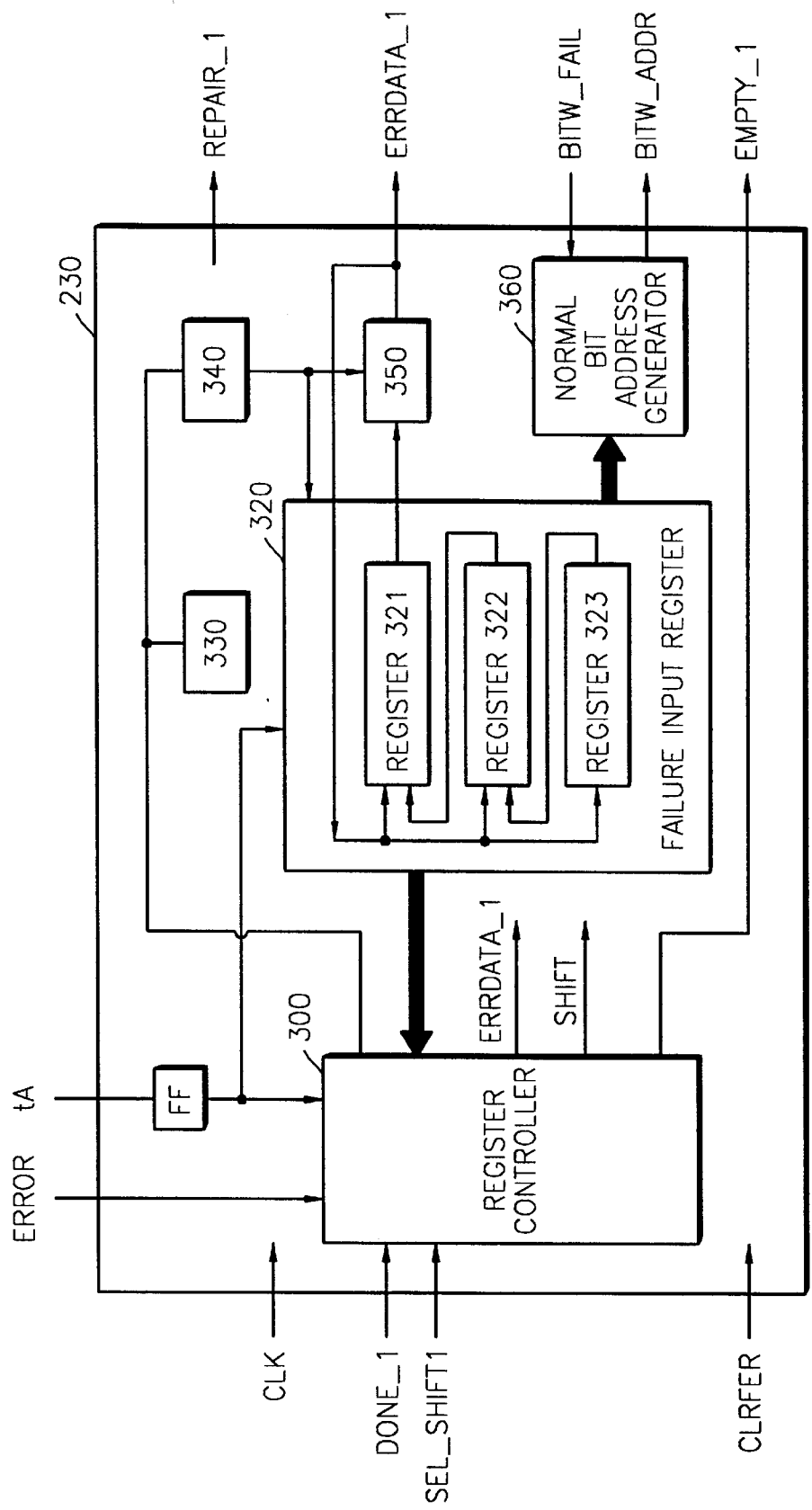
FIG. 3 is a schematic block diagram showing the failure analysis unit of FIG. 2 in detail.

The empty signals EMPTY_1 and EMPTY_2 indicate that information data for repairing the failure exists in the failure input register 320 shown in FIG. 3. The failure input register 320 will be described in detail below with reference to FIG. 3. When the failure is not found during the test or the failure cannot be repaired, the empty signals EMPTY_1 and EMPTY_2 are at the logic "high" level. When the information data for repairing the failure exists, the empty signals EMPTY_1 and EMPTY_2 transition to the logic "low" level. After the signals DONE_1 and DONE_2 transition to the logic "high" level, the failure repairing data ERRDATA is output in response to the separate selection signals SEL-SHIFT1 and SEL-SHIFT2 and the empty signals EMPTY_1 and EMPTY_2 transition to the logic "high" level.

The hold signals HOLD_1 and HOLD_2 indicate that the test operation is stopped for the retention test and is maintained to be at the logic "high" level until all the memories reach the retention test point. The hold signals HOLD_1 and HOLD_2 are transitioned to the logic "low" level when the test operation is performed again by the common driving signal START of the controller 100 after the retention test is terminated. The hold signals HOLD_1 and HOLD_2 are at the logic "high" level twice during the test.

The signals DONE_1 and DONE_2, the signals ERRORB_1 and ERRORB_2, and the repair signals REPAIR_1 and REPAIR_2 are received by the controller 100, AND gated, and output. The information data for repairing the failure for the respective memories are sequentially output through the failure repairing data ERRDATA and are serially output through a single pin, regardless of the number of memories 150,160.

Namely, the failure repairing data ERRDATA of the built-in redundancy analysis units 120 and 125, which are not selected by the separate selection signals SEL-SHIFT_1 and SEL-SHIFT_2 of the controller 100 is always maintained to be at the logic "low" level. The failure repairing data ERRDATA are output from only one of the built-in redundancy analysis units 120 and 125. The failure repairing data ERRDATA are OR gated and output through the controller 100.

In the structure of the semiconductor device, the plurality of built-in redundancy analysis units 120 and 125 are preferably controlled by a single controller 100 so that a plurality of memories can be simultaneously tested and analyzed. The number of pins and the test time are thus minimized since the failure repairing data ERRDATA including the information data on repairing failure are sequentially output through one pin. Also, signals required for the test can be generated by only an external clock signal, since a circuit which is capable of testing and analyzing repairable memories is built in, and test expenses can be minimized since all the processes can be performed by low cost test equipment.

Figure 2:
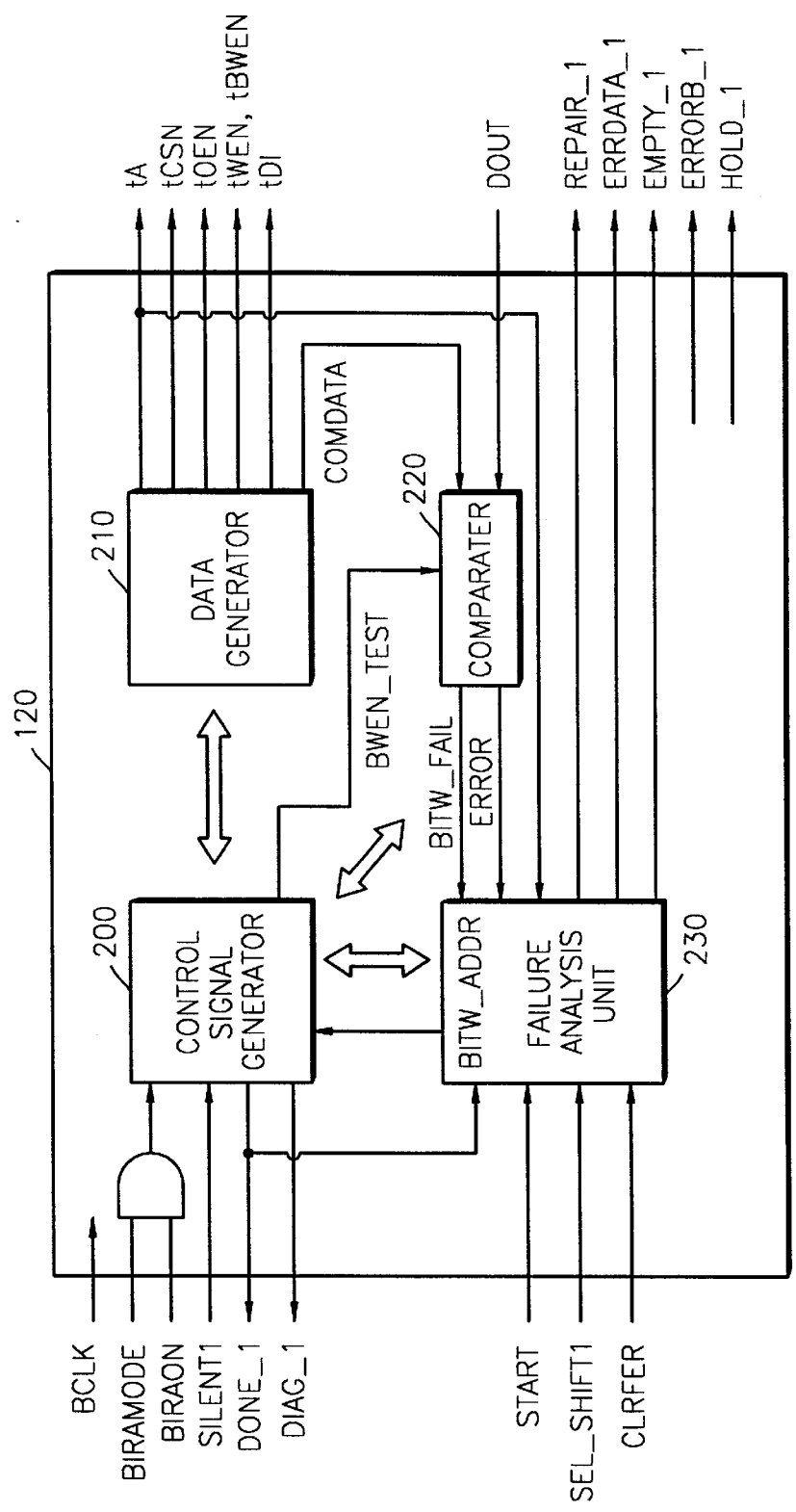
FIG. 2 is a schematic block diagram showing the built-in redundancy analysis unit of FIG. 1 in detail.

Referring to FIG. 2, since the built-in redundancy analysis units 120 and 125 have the same structure, only the first built-in redundancy analysis unit 120 will be described for convenience of explanation. Input or output signals operate in the same manner with respect to each of the built-in redundancy analysis units 120 and 125.

Referring to FIG. 2, the built-in redundancy analysis unit 120 according to the present invention, which is shown in FIG. 1, includes a control signal generator 200, a data generator 210, a comparator 220, and a failure analysis unit 230.

The control signal generator 200 receives the signal BIRAON among the common driving signals and generates signals DONE_1 and DIAG_1 among the control signals for controlling the testing and analyzing operations in response to the signal SILENT1 among the separate selection signals and the group of failure repairing information signals.

The data generator 210 is controlled by the control signal generator 200 and generates data input signals tA, tCSN, tOEN, tWEN, tBWEN and tDI for testing the corresponding memory block 150 among the memory blocks 150 and 160 and comparison data COMDATA to be compared with the read data DOUT read from the memory.

The comparator 220 is controlled by the control signal generator 200 and compares the read data DOUT read from the memory block 150 with the comparison data COMDATA.

The failure analysis unit 230 is controlled by the control signal generator 200, receives the data failure signal ERROR generated by the comparator 220 in response to the signal SEL-SHIFT1 among the separate selection signal and the signal START among the common driving signals, and generates the signals REPAIR_1, ERRDATA_1, and EMPTY_1 among the group of failure repairing information signals.

The built-in redundancy analysis unit 120 is divided into a portion for generating signals for testing repairable memories and a portion for analyzing the generated failure. When the signal BIRAON among the common driving signals and the signal SILENT1 among the separate selection signals are applied to the control signal generator 200 in a state in which the semiconductor device operates in a test mode, the control signal for controlling the testing and analyzing operation and the signals DONE_1 and DIAG_1 among the group of failure repairing information signals are generated by the control signal generator 200. The diagnosis signal DIAG_1 for examining the internal signals of the built-in redundancy analysis unit 120 is applied to the controller 100. The signal DONE_1, which indicates that the operation of the built-in redundancy analysis unit 120 is terminated, is applied to the failure analysis unit 230.

The data generator 210 is controlled by the control signal generator 200 and generates the data input signals tA, tCSN, tOEN, tWEN, tBWEN, and tDI for testing the corresponding memory block 150 among the memory blocks 150 and 160 and the comparison data COMDATA to be compared with the read data DOUT read from the memory. The data input signals tA, tCSN, tOEN, tWEN, tBWEN, and tDI will now be described. tA denotes a test address and tCSN denotes a chip select enable negative. When the chip select negative is transitioned to the logic "high" level, the power of the memory is turned off. tOEN denotes an output enable negative signal and tWEN denotes a write enable negative signal. tBWEN denotes a bit write enable negative signal and tDI is a data input signal. The tBWEN signal will be described in detail with reference to FIG. 3.

The comparator 220 is controlled by the control signal generator 200 and determines whether a memory is defective by comparing the read data DOUT read from the memory block 150 with the comparison data COMDATA, and generates a data failure signal ERROR. The failure signal BITW_Failure of a bit write function test is generated by the comparator 220 and is applied to a normal bit address generator 360 described in FIG. 3.

The failure analysis unit 230 is controlled by the control signal generator 200 and receives a data failure signal ERROR generated by the comparator 220 in response to the signal SEL_SHIFT1 among the separate selection signals, the signal START among the common driving signals, and the signal DONE_1. The data failure signal ERROR is analyzed by the failure analysis unit 230, and used to generate the signals REPAIR_1, ERRDATA_1, and EMPTY_1 among the group of failure repairing information signals, which are applied to the controller 100 together with the signal ERRORB_1 and the hold signal HOLD_1. The empty signal EMPTY_1 denotes that there exists information data for repairing failure inside the failure analysis unit 230. When the failure is not found during the test or the failure repairing cannot be performed, the data failure signal ERROR is at the logic "high" level. When information data for repairing the failure to be output exists, the empty signal EMPTY_1 is transitioned to the logic "low" level. Failure repairing data ERRDATA_1 is output in response to the separate select signal SEL-SHIFT1 generated by the controller 100 after the test is terminated and transitioned to the logic "high" level. The empty signal EMPTY_1 is a signal required for selecting only the failure repairing data ERRDATA_1 of the built-in redundancy analysis unit 120, in which the failure repairing data ERRDATA_1 exists, among a plurality of memories that are simultaneously tested, and sequentially outputting the selected failure repairing data ERRDATA_1 through the controller 100. The hold signal HOLD_1 generated by the built-in redundancy analysis unit 120 shows that the test operation is stopped for the retention test. Description of the other signals shown in FIG. 2 will be omitted since the signals were previously described in FIG. 1.

Referring to FIG. 3, the failure analysis unit 230 shown in FIG. 2 includes a register controller 300 and a failure input register 320.

The register controller 300 receives the data failure signal ERROR, uses the received data failure signal ERROR to generate the failure repairing data ERRDATA_1, which is one among the group of failure repairing information signals DONE_1, ERRORB_1, REPAIR_1, DIAG_1, HOLD_1, ERRDATA_1, and EMPTY_1, and generates a shift signal SHIFT in response to the signal SEL-SHIFT1 among the separate selection signals generated by the controller 100.

The failure input register 320 receives and stores the failure repairing data ERRDATA_1 and outputs the failure repairing data ERRDATA_1 in response to the shift signal SHIFT.

The failure analysis unit 230 can further comprise a normal bit address generator 360 for sensing the address of the failure repairing data ERRDATA_1, generating a normal bit address signal BITW_ADDR, which is the address of the memory cell that has no failure, and applying the normal bit address signal BITW_ADDR to the control signal generator 200.

The operation of the failure analysis unit shown in FIG. 2 will be described in detail with reference to FIG. 3.

The failure analysis unit 230 is divided into a portion for storing the information data for repairing failures in the failure input register 320 and outputting the information data and a portion for generating an address for a bit write function test.

The register controller 300 receives and analyzes the data failure signal ERROR generated by the comparator 220 and stores the analyzed information data for repairing the failures in the failure input register 320, which is a cache memory, as the failure repairing data ERRDATA_1. One through n registers 321, 322, and 323 exist in the failure input register 320.

After the test is terminated, the stored failure repairing data ERRDATTA_1 is output in response to the shift signal SHIFT generated by the separate selection signal SEL-SHIFT1. Namely, after checking whether the failure repairing data ERRDATA_1 exists from the built-in redundancy analysis unit 120, where a memory identification (ID) precedes, through the empty signal EMPTY_1, the corresponding separate selection signal SEL-SHIFT1 is maintained to be at the logic "high" level. After all of the failure repairing data ERRDATA_1 are output, the separate selection signal SEL-SHIFT1 of the corresponding built-in redundancy analysis unit 120 is transitioned to the logic "low" level. When all of the outputs of the failure repairing data ERRDATA_1 of the corresponding built-in redundancy analysis unit 120 are terminated or the failure repairing data ERRDATA_1 to be output do not exist, the same processes are repeated in order to search for the built-in redundancy analysis unit 125 corresponding to the next memory ID. When the outputs of the failure repairing data ERRDATA_1 of the built-in redundancy analysis units 120 and 125 are terminated or the repair signal REPAIR_1 is at the logic "low" level, the separate selection signal SEL-SHIFT1 is always maintained to be at the logic "low" level.

A conventional method, in which repetitive tests are performed, while changing the test circumstance, will be described. The test and analysis are performed in the worst case condition and the result is stored and the same test and analysis are performed in the best case condition. Then, it is checked whether the results for the two test cases are the same. In the conventional method, it can only be checked whether the same result is output in the best case condition and the worst case condition and it is difficult to analyze and repair any failure that is shown in the best condition and the worst condition.

Therefore, in the present invention, after the test is terminated, the failure repairing data ERRDATA_1 of the failure input register 320 is shifted out in a section, where the separate selection signal SEL-SHIFT1 is at the logic "high" level, and output and simultaneously input to the failure input register 320 through a feedback loop. In the failure input register 320, the failure repairing data ERRDATA_1 must be maintained after all of the failure repairing data ERRDATA_1 are output. When the failure input register 320 is not reset through a clear signal CLRFER, the stored failure repairing data ERRDATA_1 is maintained. Accordingly, the repetitive tests can be performed, while changing the test circumstances. Namely, failure repairing data ERRDATA_1 with respect to a failure found in a predetermined condition is stored. The moment the failure repairing data ERRDATA_1 is output after the test and analysis are terminated, a specific feedback loop is formed according to the number of failure repairing data items ERRDATA_1. The failure input register 320 always stores the previous result. When the test is performed after the test circumstance is changed, the failure repairing data ERRDATA_1 with respect to the failure that is additionally generated is additionally stored and output. Accordingly, it is possible to analyze failure by reflecting the test results obtained in the various conditions.

The bit write function test will now be described. A repairable memory has a bit write enable negative tBWEN signal so that a test pattern can be written in each bit. Namely, the test pattern is written with respect to the bit in which the bit write enable negative tBWEN signal and the write enable negative tWEN signal are at the logic "low" level. The bit, in which either the bit write enable negative tBWEN signal or the write enable negative tWEN signal is at the logic "high" level or both of the bit write enable negative tBWEN signal and the write enable negative tWEN signal are at the logic "high" level, is maintained to be at the previous level. It is necessary for the built-in redundancy analysis unit 120 to look for the address without failure in order to test such a characteristic of the repairable memory.

Namely, when a failure occurs in the bit write enable negative tBWEN signal, it is not possible to repair the bit with a defect. Therefore, a memory is classified as "unrepairable" regardless of the previous test result. When a defect occurs in the bit write enable negative tBWEN signal, the built-in redundancy analysis unit 120 performs the test, analyzes the failure input register 320, and designates the address without failure. When the bit write function test is performed on the address with failure, the semiconductor memory device, which is repairable, is classified as "unrepairable". Therefore, yield can be deteriorated. After a specific value is written by the built-in redundancy analysis unit 120 in a state where the bit write enable negative tBWEN signal and the write enable negative tWEN signal are at the logic "low" level with respect to the address with no failure, the complement value of the previously written value is written in a state where the bit write enable negative tBWEN signal is at the logic "high" level and the write enable negative tWEN signal is at the logic "low" level. Since the memory cell must maintain the previous value in a state where the bit write enable negative tBWEN signal is at the logic "high" level, the function of the bit write enable negative tBWEN signal can be tested by comparing the memory output with an estimated value.

The normal bit address generator 360 senses the address of the failure repairing data ERRDATA_1, generates a normal bit address signal BITW_ADDR, which is the address of the memory cell without failure, and applies in order to perform the bit write function test of the repairable memory. When the failure is generated in the result obtained by performing the bit write function test with respect to the address generated by the normal bit address generator 360, the repair signal REPAIR_1 is unconditionally at the logic "low" level, which shows that the failure cannot be repaired.

A shift calculator 330 applies the number of failures to the register controller 300 and causes the register controller 300 to shift out several bits and determine whether the failure repairing data ERRDATA_1 is output.

A failure calculator 340 senses how many registers among the internal registers 321, 322, and 323 of the failure input register 320 have the failure repairing data ERRDATA_1.

A failure memory ID 350 senses the ID of the memory with failure of the failure repairing data ERRDATA_1.

Figure 4:
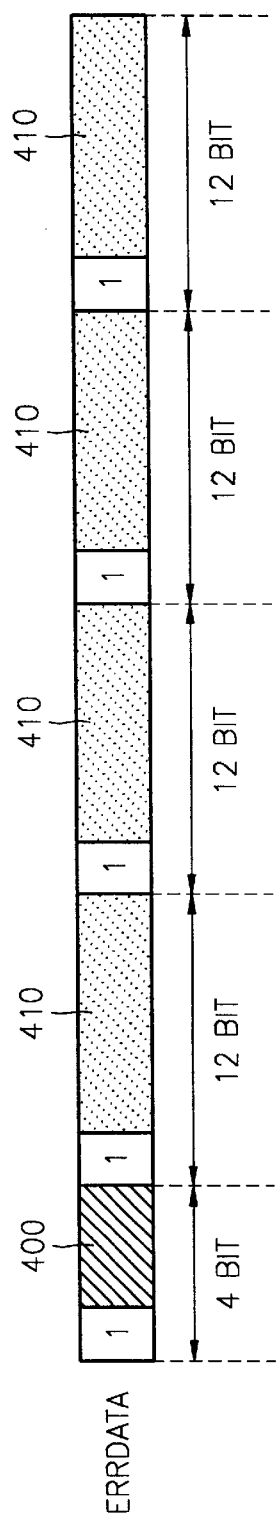
FIG. 4 shows the output of failure repairing data with respect to one memory of the semiconductor device according to an embodiment of the present invention, which is shown in FIG. 1.

Referring to FIG. 4, the information data for repairing the failure is output through the failure repairing data ERRDATA_1 when the repair signal REPAIR_1 is maintained to be at the logic "high" level and the signal ERRORB_1 is at the logic "low" level after the test is terminated. Since ability of storing data is restricted in the case of low cost test equipment, the failure repairing data ERRDATA_1 are serially output through one pin regardless of the number of memories.

FIG. 4 shows that the information data for repairing the found failure is output through the failure repairing data ERRDATA_1. It is shown that the output of the failure repairing data ERRDATA_1 starts by maintaining the initial one bit is always at the logic "high" level. The number of failure information packets 410 to be output is informed through the next three bits 400. When there is no failure, the information data for repairing failure is not output and the failure repairing data ERRDATA_1 is maintained to be at the logic "low" level. Since many memories having various sizes are simultaneously tested and analyzed and are sequentially output unlike in the conventional method, a failure memory ID code is periodically output. Accordingly, the respective memories can be identified. Therefore, it is possible to obtain the test results with respect to all of the tested memories and information on repairing defects by analyzing an output serial signal after the test is terminated.

Figure 5:
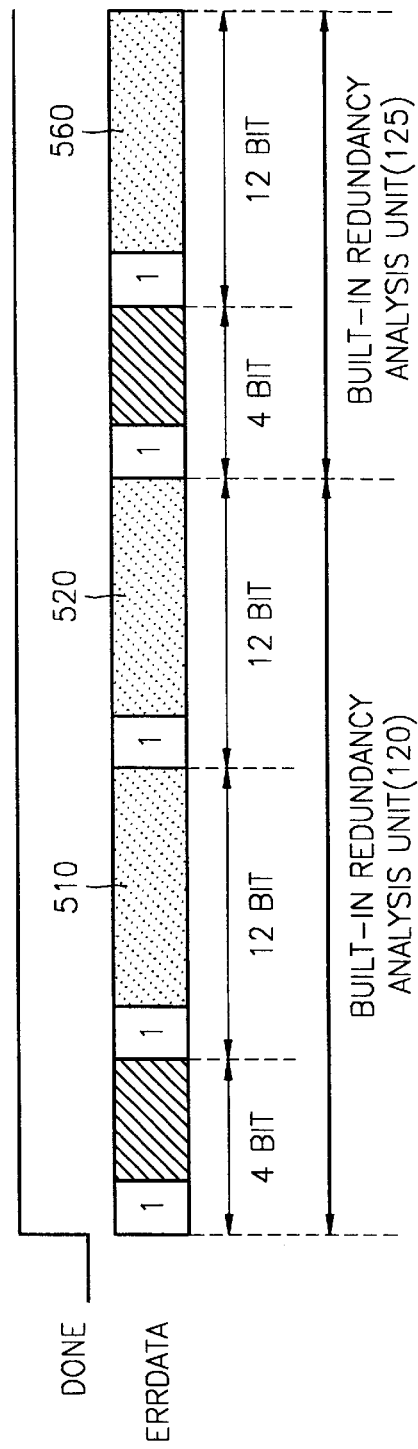
FIG. 5 shows the output of failure repairing data with respect to two or more memories of the semiconductor device according to the embodiment of the present invention, which is shown in FIG. 1.

Referring to FIG. 5, each memory has a unique memory ID and the failure repairing data ERRDATA with respect to various memories are output in a predetermined order of memory IDs with respect to the memories with defects. FIG. 5 shows that the failure repairing data ERRDATA_1 and ERRDATA_2 are output with respect to two memories among the tested memories. Namely, the failure repairing data ERRDATA_1 of the built-in redundancy analysis unit 120 shows that two information data items 510 and 520 for repairing failure exits. The failure repairing data ERRDATA_2 of the built-in redundancy analysis unit 125 shows that one information data for repairing failure exists. When 4 memories that are tested exist, it shows that the remaining two memories have no failure. In such a method, the memory that needs the output of the failure repairing data ERRDATA among the various tested memories is selected by the controller 100 and controlled. Accordingly, minimum data is output. This has an advantage in that restriction on the storage ability of data with respect to one pin when low cost test equipment is used can be minimized.

Referring to FIG. 6, after all of the memories are tested and analyzed, the signal DONE is maintained to be at the logic "high" level. The empty signal EMPTY is received from the built-in redundancy analysis units 120 and 125 by the controller 100 and the separate selection signal SEL-SHIFT is applied to the built-in redundancy analysis units 120 and 125. Accordingly, the failure repairing data ERRDATA is output. Referring to FIG. 6, since the empty signals EMPTY_1, EMPTY_2, and EMPTY_4 with respect to the respective memories are at the logic "low" level in a state where the initial signal DONE is at the logic "high" level, this shows that there exists the failure repairing data ERRDATA to be output with respect to the memories RAM1, RAM2, and RAM4.

Only the separate selection signal SEL-SHIFT1 is controlled by the controller 100 to be at the logic "high" level by the number of clocks, in which the failure repairing data ERRDATA_1 with respect to the initial first memory RAM1 can be output in a state where the signal DONE is at the logic "high" level. Therefore, only information on the failure of the designated first memory RAM1 is output by the failure repairing data ERRDATA_1 which is a serial signal. When the outputs of the failure repairing data ERRDATA_1 with respect to the first memory RAM1 are terminated, the empty signal EMPTY_1 is transitioned to the logic "high" level and the separate selection signal SEL-SHIFT1 is transitioned to the logic "low" value. After the failure repairing data ERRDATA_1 with the first memory RAM1 are output by the controller 100, the failure repairing data ERRDATA_2 with respect to the second memory RAM2 are output. Namely, when the separate selection signal SEL-SHIFT2 with respect to the second memory RAM2 is transitioned to the logic "high" level and the failure repairing data ERRDATA_2 with respect to the second memory RAM2 are output, the empty signal EMPTY_2 is transitioned to the logic "high" level and the separate selection signal SEL-SHIFT2 is transitioned to the logic "low" level. Since the empty signal EMPTY_3 is at the logic "high" level with respect to a third memory (not shown), this means that failure repairing data ERRDATA_3 to be output (not shown) does not exist. The outputs of the failure repairing data ERRDATA_3 (not shown) by the controller 100 are omitted. The outputs of failure repairing data ERRDATA_4 are performed in the same manner with respect to a fourth memory RAM4, in which an empty signal EMPTY_4 is at the logic "low" level.

After the outputs of the information data for repairing failure are terminated with respect to all of the memories, the failure repairing data ERRDATA are maintained to be at the logic "low" level. When a memory is un-repairable since the repair signal REPAIR is at the logic "low" level, the failure repairing data ERRDATA are always maintained to be at the logic "low" level in order to prevent data, which is not required for test equipment, from being stored and the information data for repairing failure are not output. Assuming 8 memories are tested in FIG. 6, the resulting data indicates that failure is not found in the remaining 5 memories. Since a plurality of failure repairing data ERRDATA are serially output, one pin can be maintained regardless of the number of memories. Accordingly, the number of pins can be minimized. It is possible to minimize the time spent on outputting the failure repairing data ERRDATA of all the memories and to minimize the amount of data to be stored in low cost equipment by successively outputting only necessary information among the respective memories.

Referring to FIG. 7, in general, the time spent on the retention test is much longer than the time spent on testing and analyzing the memory. Therefore, when the retention test is separately performed with respect to each memory, test expenses increase. Therefore, when a plurality of memories are used, the retention test is preferably simultaneously performed on all of the memories in order to minimize the retention test time and the conditions should be maintained to be the same in order to minimize the retention test time. The retention test is performed by writing the logic "low" or "high" level with respect to all of the cells and reading the logic "low" or "high" level after the time of 50 ms has passed. The failure repairing data ERRDATA and the signal DONE indicate the point of time at which the retention test is to be performed. Other memories are maintained in the hold state HOLD in the retention test condition until the memory having the largest size meets the retention test condition. When all of the memories meet the retention test condition, the retention test is simultaneously performed on all of the memories. After the retention test is terminated, the remaining tests are performed by the built-in redundancy analysis units 120 and 125. In FIG. 7, a retention test section 710 is shown and "DISTURB" and "MARCH" respectively refer to the test patterns of the memory.

It is possible to reduce the test time compared to that in a conventional method, where the retention test is performed on the respective memories, by simultaneously performing the retention test on which the largest time is spent, on all of the memories by controlling the retention test point to be the same with respect to the built-in redundancy analysis units 120 and 125 with the controller 100. Also, since the retention test is positioned in the rear portion of the entire tests, an unnecessary retention test is not performed on the un-repairable memory through the repair signal REPAIR. Even though an arbitrary memory is selectively tested and analyzed, the work specification of the retention test is not changed. It is possible to simplify the test work specification since it is not necessary to change the retention test point according to the size of the selected memory.

As mentioned above, according to the semiconductor device according to the present invention, a plurality of memory units having different sizes can be simultaneously tested and analyzed by the controller and the built-in redundancy analysis units. The number of output signals of the controller connected to test equipment is maintained to be 5 regardless of the number of memory units. Accordingly, since the number of pins is minimized, low cost test equipment can be utilized.

Also, since all of the memories are simultaneously tested and the test results are sequentially output, it is possible to minimize the test time, as compared to a method by which each memory is separately tested.

It is possible to reduce the test time and expenses since the retention test can be simultaneously performed on all of the memories through a built-in circuit under the same condition. When the repetitive tests are performed in various test circumstances, the previous test result is internally stored and reflected on the new test result. Therefore, the analysis can be performed on the failure found in the specific condition.

In the drawings and specification, there have been disclosed preferred embodiments of the invention and, although specific terms are employed, they are used in a generic and descriptive sense only and not for purposes of limitation, the scope of the invention being set forth in the following claims. Therefore, it will be understood by those skilled in the art that various changes in form and details may be made therein without departing from the spirit and scope of the invention as defined by the appended claims.

What is claimed is:

1. A semiconductor device, comprising:
   a plurality of memory blocks;
   a plurality of built-in redundancy analysis units for outputting a group of failure repairing information signals by testing and analyzing a corresponding memory block among the plurality of memory blocks in response to common driving signals and each of a plurality of independent selection signals; and
   a controller for generating the common driving signals and the respective independent selection signals in response to a plurality of externally applied control signals and sequentially receiving and sequentially outputting the group of failure repairing information signals generated by the respective built-in redundancy analysis units.

2. The semiconductor device of claim 1, wherein each of the built-in redundancy analysis units comprises:
   a control signal generator for generating a control signal for controlling the testing and analyzing operations and a subset of a group of failure repairing information signals in response to a subset of the common driving signals and a subset of the independent selection signals;
   a data generator controlled by the control signal generator, the data generator for generating data input signals for testing a corresponding memory block among the memory blocks and generating comparison data to be compared with read data read from the memory;
   a comparator controlled by the control signal generator, the comparator for comparing read data read from the memory block with the comparison data; and
   a failure analysis unit controlled by the control signal generator, the failure analysis unit for receiving a data failure signal generated by the comparator in response to other signals among the independent selection signals and other signals among the common driving signals and generating other signals among a group of failure repairing information signals.

3. The semiconductor device of claim 2, wherein the failure analysis unit comprises:
   a register controller for receiving the data failure signal and using the data failure signal to generate failure repairing data, which is one of a group of failure repairing information signals, and generating a shift signal in response to a subset of independent selection signals generated by the controller; and
   a failure input register for receiving and storing the failure repairing data and outputting the failure repairing data in response to the shift signal.

4. The semiconductor device of claim 3, wherein the failure analysis unit further comprises a normal bit address generator for sensing the address of the failure repairing data, for generating a normal bit address signal which is an address of a memory cell with no failure, and for applying the generated normal bit address to the control signal generator.

5. The semiconductor device of claim 3, wherein the failure input register comprises first through nth registers.

6. The semiconductor device of claim 3, wherein the failure input register feeds back the output failure repairing data and sequentially stores the failure repairing data in the first through nth registers by the number of failure repairing data.

7. A failure analyzing method with respect to a semiconductor device comprising a plurality of memory blocks, comprising the steps of:

(a) applying a plurality of control signals generated external to the semiconductor device;

(b) generating common driving signals and a plurality of independent selection signals in response to the control signals;

(c) testing and analyzing the respective memory blocks and generating and storing a group of failure repairing information signals with respect to the memory blocks in response to the common driving signals and each of the independent selection signals; and (d) sequentially receiving the group of failure repairing information signals and sequentially outputting the group of failure repairing information signals.

8. The method of claim 7, wherein the failure analyzing method further comprises the step of:

(e) simultaneously performing a retention test on the plurality of memory blocks in response to the common driving signals.

9. The method of claim 7, wherein the step (c) comprises the steps of:

(c1) generating a subset of the test control signals and the group of failure repairing information signals in response to a subset of the common driving signals and a subset of the independent selection signals;

(c2) generating memory control signals for controlling the memory block, write data to be written in the memory block, and comparison data to be compared with read data read from the memory block, in response to a subset of the test control signals;

(c3) comparing the read data read from the memory block with the comparison data in response to other signals among the test control signals; and (c4) receiving the comparison result as a data failure signal, generating other signals of the group of failure repairing information signals, and outputting the other signals, in response to other signals among the test control signals, a subset of the of the independent selection signals, and a subset of the common driving signals.

10. The method of claim 9, wherein the step (c4) comprises the steps of:

(c41) generating a shift signal in response to other signals among the test control signals and a subset of the independent selection signals, receiving the data failure signal, and generating failure repairing data, which is one of the group of failure repairing information signals; and (c42) receiving and storing failure repairing data, which is one of the group of failure repairing information signals and outputting the failure repairing data in response to the shift signal.

11. The method of claim 10, wherein the step (c4) further comprises the step of sensing the address of the failure repairing data and generating a normal bit address signal, which is the address of a memory cell without failure.

* * * * *